Figure 1:
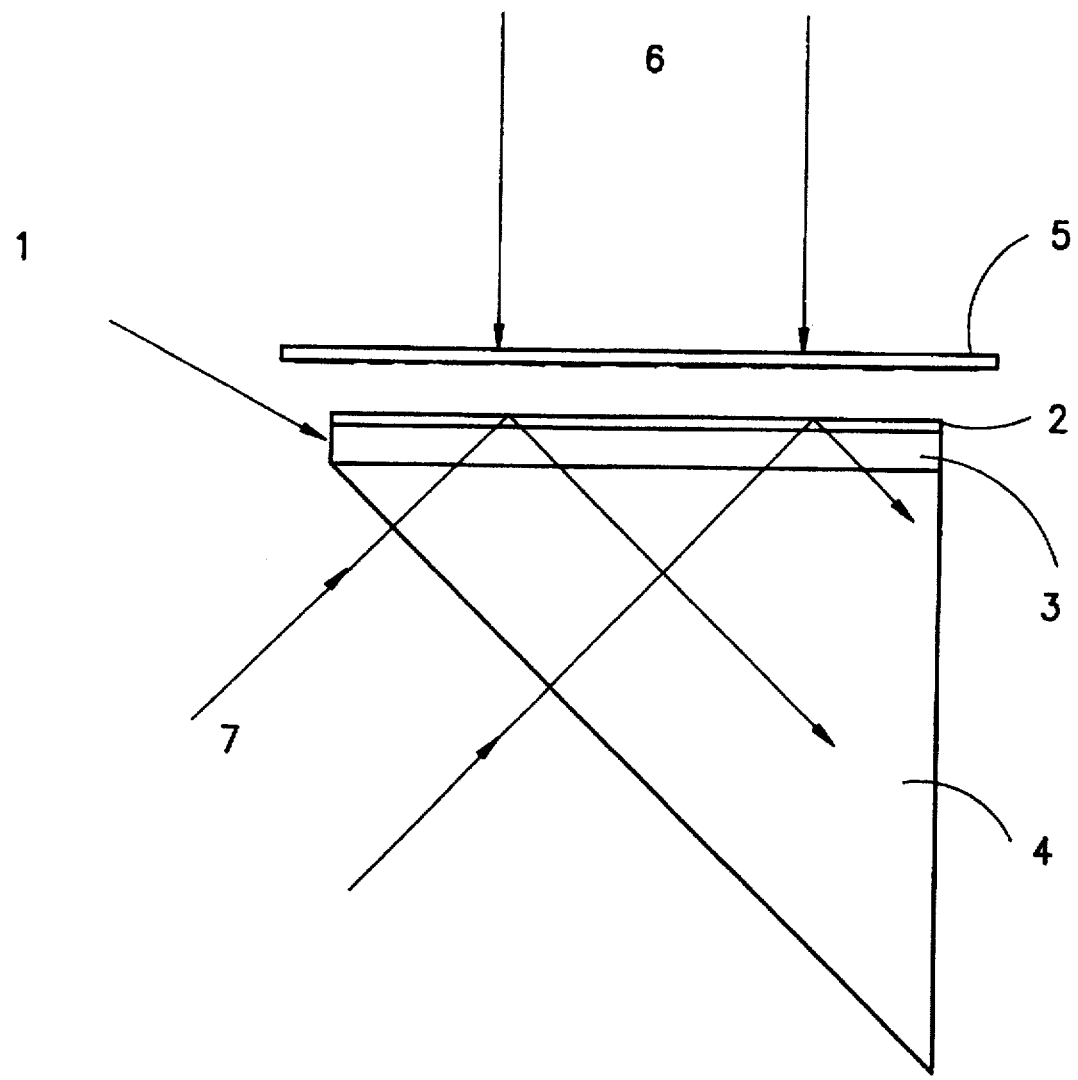

United States Patent [19]

Clube

[11] Patent Number: 5,695,894
[45] Date of Patent: Dec. 9, 1997

[54] METHOD AND APPARATUS FOR CHANGING THE SCALE OF A PATTERN PRINTED FROM A TOTAL INTERNAL REFLECTION HOLOGRAM

[75] Inventor: Francis Stace Murray Clube, Neuchâtel, Switzerland

[73] Assignee: Holtronic Technologies Ltd., Marin, Switzerland

[21] Appl. No.: 756,887

[22] Filed: Dec. 2, 1996

Related U.S. Application Data

[63] Continuation of Ser. No. 380,148, Jan. 27, 1995, abandoned, which is a continuation of Ser. No. 65,488, May 24, 1993, abandoned.

[51] Int. Cl.$^6$ ...................................................... G03F 9/00
[52] U.S. Cl. ...................... 430/1; 430/2; 430/5; 430/397; 430/30; 359/1; 359/3; 359/12; 359/35
[58] Field of Search .................... 430/1, 2, 5, 397, 430/30, 290, 945; 358/1, 8, 12, 35

[56] References Cited

U.S. PATENT DOCUMENTS

| | | | |
|---|---|---|---|
| 3,610,721 | 10/1971 | Abramson et al. | 430/1 |
| 3,876,303 | 4/1975 | Talts | 430/30 |
| 4,021,239 | 5/1977 | Ogawa | 430/397 |
| 4,735,877 | 4/1988 | Kato et al. | 430/5 |
| 4,872,747 | 10/1989 | Jalkio et al. | 350/421 |
| 4,935,334 | 6/1990 | Boettinger et al. | 430/5 |
| 4,966,428 | 10/1990 | Phillips | 356/12 |
| 5,023,462 | 6/1991 | Yamada et al. | 250/398 |
| 5,157,746 | 10/1992 | Tobita et al. | 430/127 |
| 5,187,372 | 2/1993 | Clube | 356/401 |

FOREIGN PATENT DOCUMENTS

| | | |
|---|---|---|
| 0421645 | 9/1990 | European Pat. Off. . |
| 0627666 | 5/1994 | European Pat. Off. . |
| 3910048 | 8/1990 | Germany . |
| 56-3618 | 1/1981 | Japan ........................ 430/397 |
| 1532655 | 11/1975 | United Kingdom . |
| 2211957 | 10/1987 | United Kingdom . |
| 2249387 | 5/1992 | United Kingdom ........................ 430/1 |
| 2267356 | 12/1993 | United Kingdom . |
| 2293459 | 3/1996 | United Kingdom . |

OTHER PUBLICATIONS

Magnification Aberrations in Fourier-Transform Optical Data Storage, Journal the Optical Socíatety of American vol. 61, No. 7, Jul. 1971, Sudbury, Massachusetts, USA, pp. 915-923.

Primary Examiner—Martin Angebranndt
Attorney, Agent, or Firm—Cumpston & Shaw

[57] ABSTRACT

An apparatus is disclosed for changing the scale of a pattern printed from a total internal reflection hologram into a photosensitive layer, which apparatus includes means for reconstructing an image from said total internal reflection hologram by illuminating said total internal reflection hologram with a scanning beam and means for moving at least one of the hologram and photosensitive layer such that the magnitude of movement of the hologram relative to the photosensitive layer is equal to that of the scanning beam multiplied by the change of scale required and such that if said change of scale is a magnification the direction of said movement of the hologram relative to the photosensitive layer is the same as that of the scanning beam whereas if said change of scale is a demagnification then the direction of said movement of the hologram relative to the photosensitive layer is opposite to that of the scanning beam, and optionally comprising also means for increasing or reducing the convergence or divergence of the scanning beam so that the image reconstructed from said TIR hologram by said scanning beam possesses the change in the scale.

27 Claims, 3 Drawing Sheets

METHOD AND APPARATUS FOR CHANGING THE SCALE OF A PATTERN PRINTED FROM A TOTAL INTERNAL REFLECTION HOLOGRAM

This application is a continuation of application Ser. No. 08/380,148 filed on Jan. 27, 1995, now abandoned.

This invention relates to the field of microlithography, in particular to microlithography based on total internal reflection holography.

Devices composed of microstructures, most notably integrated circuits and active-matrix liquid crystals displays, largely depend on photolithographic methods for their manufacture. The most common form of photolithography executes a transfer of a pattern of features defined in a mask into a photosensitive layer on a substrate surface. Following development of the photosensitive layer the substrate is subjected to a chemical treatment such as an etching, deposition or implantation, in order that the pattern recorded in the layer is transferred into a material that will provide the required device characteristics. For most device applications this sequence is performed not just once but several times using different mask patterns and different post-exposure treatments to construct the complex, many-layered structure of the device.

For these multi-exposure processes it is important that the features in each layer are accurately registered, or aligned, with respect to those in other layers.

Quantifying this, the alignment must typically be carried out to an accuracy of ~⅕ of the dimension of the smallest feature. Lithographic equipment performs alignment by measuring the degree of misalignment between reference marks included in the mask and on the wafer and then translating and/or rotating the mask (or wafer) to its aligned position, after which exposure can procede.

There are cases however where this procedure is insufficient for ensuring accurate overlay of features over the entire exposure field, at least not without compromising the size of the field. Some post-exposure treatments, especially thermal processings, can cause an appreciable expansion or shrinkage of the substrate material which may be as large as 1 part in $10^4$, whereby a 50 cm substrate may expand by as much as 50 µm.

One way of producing good overlay is to reduce the size of the exposure field so that the increase in substrate dimensions over that field becomes negligible compared to the overlay accuracy required. For large substrates however this would demand a large number of exposure operations to cover the complete substrate area, and this, for a commercial process, would be undesirable. The preferred approach is to measure the magnitude of the substrate expansion or shrinkage (using the alignment reference marks) and then to magnify or demagnify the image projected from the mask so that it compensates for the substrate's change in scale. For lithographic equipment based on conventional reflective or refractive imaging optics, an image (de)magnification can be relatively simply produced by longitudinally displacing a lens or mirror in the imaging system. For lithographic systems based on total internal reflection holography another solution must be found.

The principles of total internal reflection (TIR) holographic lithography are illustrated in FIG. 1. A holographic plate 1 comprising a holographic recording layer 2 on a substrate 3 is put into optical contact with the base of a prism 4. An object in the form of a mask 5 is located in proximity to the recording layer 2. Two mutually coherent beams illuminate the system, one of which, the object beam 6, passes through the mask 5 to the recording layer 2 and the other, the reference beam 7, illuminates the hypotenuse face of the prism 4 so that it is totally internally reflected from the surface of the holographic layer 2. The optical interference of the two beams 6 and 7 is recorded by the photosensitive material in the holographic layer 2 to form the TIR hologram. Following development and/or fixing of the hologram, the hologram is reconstructed by orienting the hologram substrate 3 on the prism 4 such that it is rotated through 180° with respect to its orientation during recording. Illumination by beam 7 generates an image of the pattern contained in the original mask 5. This image may be used to perform lithography. TIR holographic lithography offers a number of important advantages over conventional lithography. Unlike lens or mirror imaging systems it permits both high resolution imaging and a very large exposure field, enabling, for instance, 0.5 µm features to be printed over 400×400 $mm^2$ substrates in a single exposure. The successful application of TIR holography to microlithography has required the development and integration of a number of additional techniques and subsystems, in particular i) a scanning illumination system for providing a good uniformity of printing exposure (U.S. Pat. No. 4,966,428), ii) a means for accurately measuring and adjusting the local separation between the hologram and the substrate where the hologram is being reconstructed in order that a uniformly focussed image is printed, and iii) alignment systems for enabling accurate overlay (U.S. Pat. No. 5,187,372). The background art though does not provide a method for (de)magnifying the pattern printed from a TIR hologram: the scale of the image pattern compared to the pattern in the original mask is strictly 1:1. Without this capability TIR holographic lithography cannot satisfactorily address certain fields of application, in particular, active-matrix flat panel displays.

It is therefore an object of the present invention to provide a method and apparatus for changing the scale of a pattern printed from a total internal reflection hologram. A change in scale is hereafter defined as a fractional change in dimension from the dimension of the the original mask pattern. It is assumed that there has been no change in scale of the holographic layer between recording and reconstruction due to, for instance, thermal expansion or shrinkage of the substrate, though the method of the present invention could be employed to compensate for such a change.

According to a first aspect of the present invention there is provided a method of changing the scale of a pattern printed from a total internal reflection hologram into a photosensitive layer, which method comprises a) reconstructing an image from said total internal reflection hologram by illuminating said total internal reflection hologram with a scanning beam; and b) moving at least one of the hologram and photosensitive layer such that the magnitude of movement of the hologram relative to the photosensitive layer is equal to the magnitude of movement of the scanning beam multiplied by the change of scale and such that if the change of scale is a magnification the direction of said movement of the hologram relative to the photosensitive layer is the same as that of the scanning beam, whereas if the change of scale is a demagnification the direction of said movement of the hologram relative to the photosensitive layer is opposite to that of the scanning beam.

This method however produces some loss in definition of the printed image. Although for low resolution patterns and/or small changes in scale this degradation is very small and can usually be neglected, for high resolution patterns and/or large changes in scale, it cannot. For these cases the method of the present invention can be enhanced so that it further comprises changing the degree of convergence or divergence of the scanning beam in order that the image reconstructed from said total internal reflection hologram by said scanning beam possesses the change in scale.

According to a second aspect of the present invention there is provided an apparatus for changing the scale of a pattern printed from a total internal reflection hologram into a photosensitive layer, which apparatus includes a) a means for reconstructing an image from said internal reflection hologram by illuminating said total internal reflection hologram with a scanning beam; and b) a means for moving at least one of the total internal reflection hologram and photosensitive layer such that the magnitude of movement of the hologram with respect to the photosensitive layer is equal to the magnitude of movement of the scanning beam multiplied by the change of scale and such that if said change in scale is a magnification the direction of said movement of the hologram relative to the photosensitive layer is the same as that of the scanning beam whereas if said change in scale is a demagnification the direction of said movement of the hologram relative to the photosensitive layer is opposite to that of the scanning beam.

For high resolution patterns and/or large changes in scale, the apparatus of the present invention can be enhanced by a means for changing the degree of convergence or divergence of the scanning beam in order that the image reconstructed from said TIR hologram by said scanning beam possesses the change in scale. A means for changing the degree of convergence of divergence of the scanning beam includes an anamorphic optical element, such as a prism, in order that the change of scale of the reconstructed image is substantially isotropic.

Figure 2:
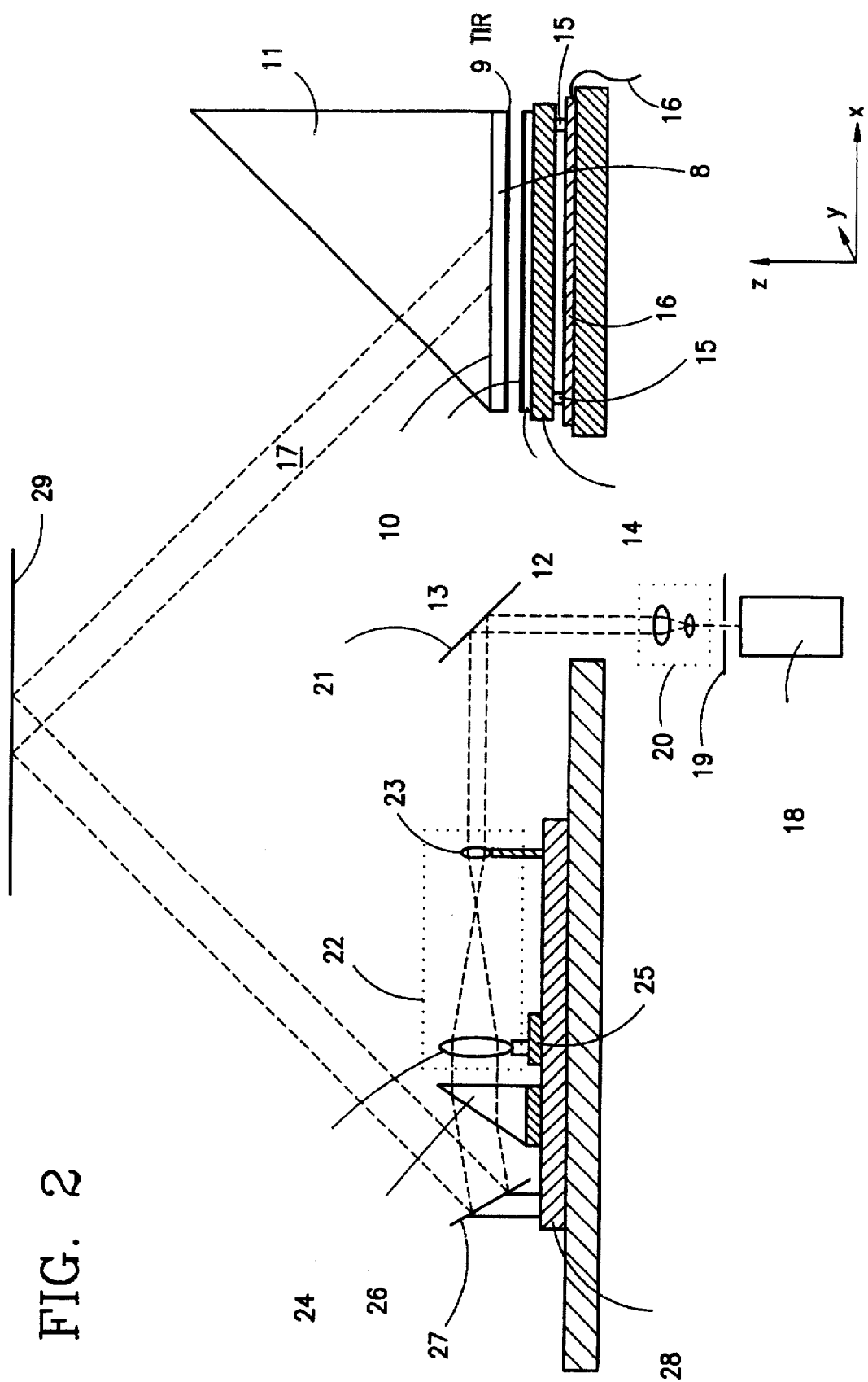

Preferred embodiments of the invention will now be described in detail by way of example with reference to the accompanying drawings in which:

FIG. 1, already described, shows the main principles of TIR holography;

FIG. 2 schematically shows a TIR holographic lithographic system incorporating the present invention.

Figure 3:
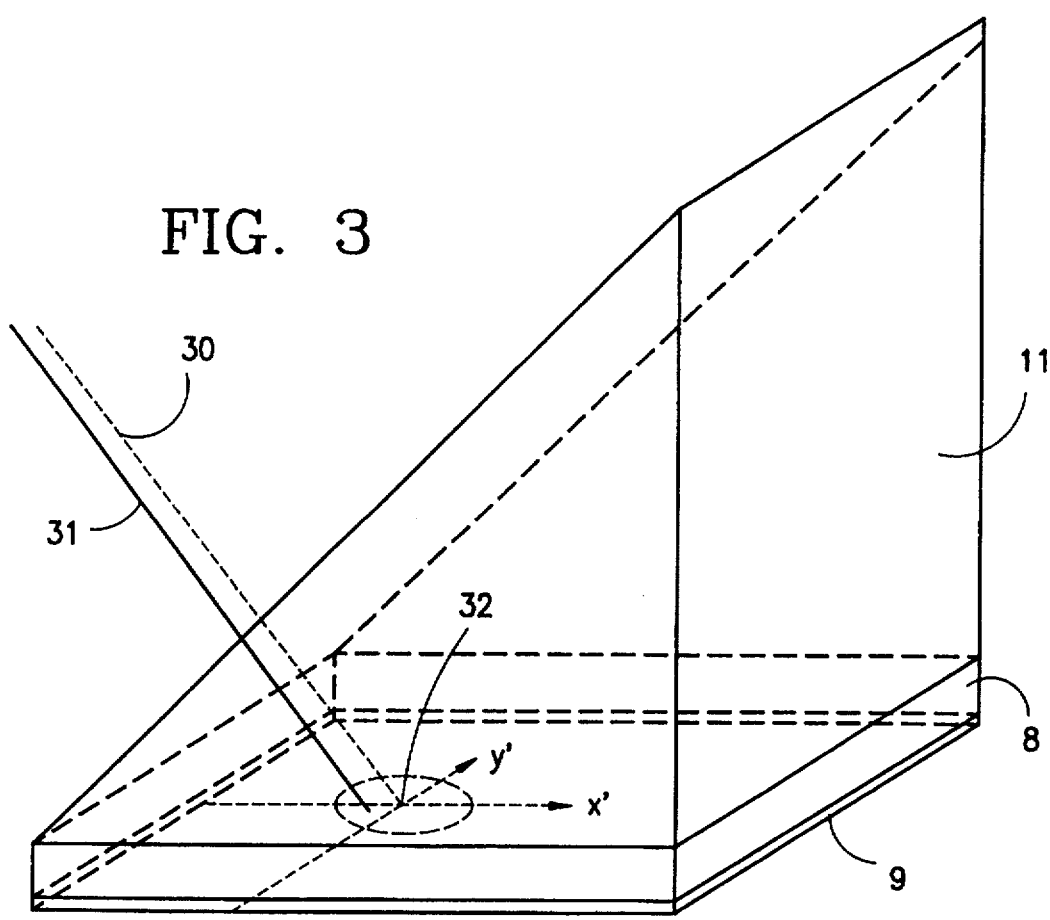

FIG. 3 schematically shows a decollimated beam as it scans a hologram.

Figure 4A:
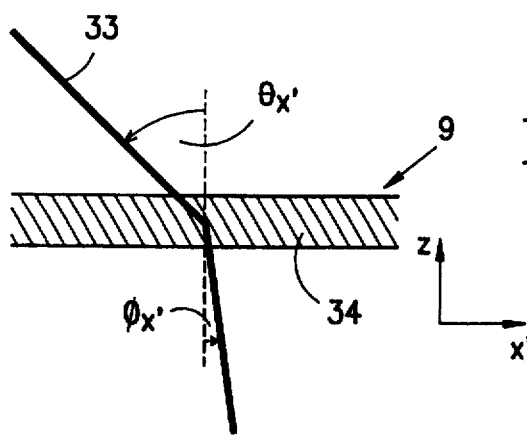
Figure 4B:
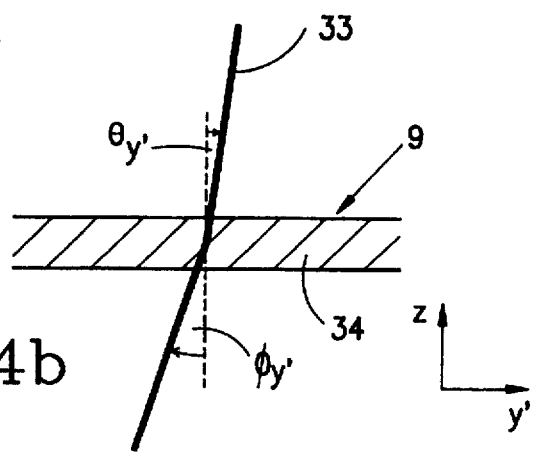

FIGS. 4a and 4b show the diffraction of a ray by a TIR hologram as viewed in the xz and yz planes respectively.

Referring first to FIG. 2, a 6" square substrate 8 supporting a TIR hologram 9 on its lower surface is placed in optical contact by way of a refractive index matching fluid 10 with the base of a 45°, 45°, 90° glass prism 11. A suitable material for the hologram substrate 8 is fused silica because of its low coefficient of thermal expansion. A suitable material for the refractive index matching fluid 10 is the low volatility hydrocarbon xylene.

The TIR hologram 9 was recorded according to the prior art, using a collimated object beam to illuminate the pattern in the mask at normal incidence, a collimated reference beam to illuminate the holographic layer at 45° incidence (angle in the prism) and a separation between mask and holographic layer of 200 μm. The recording material was a 15 μm layer of HRS-352, a high-resolution, low-scatter photopolymer manufactured by DuPont de Nemours & Co.

The angular orientation of the hologram substrate 8 on the prism 11 is such that a beam normally incident on the hypotenuse face of the prism 11 illuminates the hologram 9 in the reverse direction to the reference beam during recording.

A silicon wafer 12 coated with a layer of photoresist 13 on its upper surface and mounted to a vacuum chuck 14 is positioned using piezoelectric transducers 15 so that the photoresist layer 13 lies at a distance of 200 μm from the surface of the hologram 9 and parallel thereto.

Determination of the separation and degree of parallelism between hologram 9 and photoresist layer 13 are preferably obtained interferometrically by introducing laser beam(s) through the vertical face of the prism 11 and detecting the interference of the beams reflected from the surfaces of the hologram 9 and photoresist layer 13. In order that the reconstructed image remains accurately focussed on the photoresist 13 during the subsequent printing it is further desirable that the measurement laser beam(s) scan superposed with the printing beam in order that continuous local measurements are made and the separation dynamically corrected using the piezoelectric transducers 15. (This measurement apparatus is however not shown in the figure since it is not intrinsic to the invention and is in any case well described in the background art. See for instance EP-A-02421645 and reference 6).

The piezoelectric transducers 15 are mounted to a computer-controlled stage 16 permitting translation of the wafer 6 in the x and y directions. The stage has a resolution of movement of ~10 nm.

The beam 17 for reconstructing the hologram 9 is derived from an argon ion laser 18 operating at a wavelength of 363.8 nm, the same as used for hologram recording. With the shutter 19 open, the beam from the laser 18 passes through a beam expander 20, producing a collimated beam with a Gaussian intensity profile and diameter ~5 cm (defined by $1/e^2$ intensity points). The beam is then deflected by a mirror 21 so that it travels parallel to the x axis. Whereas the diagram shows, for reasons of ease of illustration, the output of the laser 18 to be travelling in the z direction and the mirror 21 to be oriented such that the beam is directed in the x direction, in actual fact the output of the laser 18 is in the y direction and the mirror 24 is oriented correspondingly (see scanning system below).

From the mirror 21 the beam travels through a beam decollimator 22 comprising two infinite conjugate lenses (doublets) 23 and 24, the first of which 23 has an aperture 1 cm and a focal length 2.5 cm and the second 24 has an aperture 4 cm and a focal length 10 cm, the two being separated by the sum of their focal lengths. Whereas the first lens 23 is fixed, the second lens 24 is mounted to a stage 25 that can be incremented in the x direction with a resolution of movement of 10 μm over a range of travel of 10 mm.

The beam leaving the beam decollimator 22 is then normally incident on a face of a 32.3°, 57.7°, 90° prism 26 (the refractive index of prism material=1.5) which functions as a one-dimensional beam compressor, reducing by a factor 2½ the diameter of the beam in the xz plane. The beam collimator 22, beam-compressor prism 26 and a deflector mirror 27 are mounted to a stage 28 that is part of a computer-controlled scanning system for generating a raster scan of the beam across the mirror 29 and thence the hologram 9 (Note: the scanning system and wafer translation stage 17 are controlled from the same computer so that their motions can be easily coupled). Although a raster pattern is the preferred form of the scanning motion, other patterns could be employed. The scan-passes of the raster pattern are produced by the stage 28 travelling in the x direction whilst the steps between scan-passes are produced by another stage (not shown in the figure) that translates the stage 28 and mirror 21 in the y direction. The beam scans in the x direction with a speed of 10 cm/s and the size of step in the y direction is chosen to be ~5 mm so that the integrated exposure energy at the hologram 9 is made highly uniform. The propagation distance of the beam from lens 24 of the beam decollimator 22 to the hologram 9 is 1 meter.

If lens 24 is positioned with respect to lens 23 so that the scanning beam 17 is accurately collimated, the image reconstructed from the hologram 9 has the same dimension as the pattern defined in the original mask. The procedure, in general terms, for producing a change in scale of the printed pattern is now described.

First, lens 24 of the beam decollimator 22 is longitudinally displaced to decollimate the beam emerging from lens 24. Expressing beam decollimation in terms of the angle the rays at the $1/e^2$ radius make with the central ray (a positive decollimation referring to a divergence and a negative decollimation referring to a convergence) the decollimation of the beam emerging from the lens 24 produced by a displacement x of lens 24 towards lens 23 is given by:

$$W = \frac{Rx}{F^2} \qquad \text{equ. (1)}$$

where R is the $1/e^2$ radius of the beam emerging from lens 24 and F is the focal length of lens 24.

The decollimated beam then passes through the beam-compressor prism 26, which, in addition to reducing by a factor 2½ the diameter of the beam in the xz plane, also increases by the same factor the decollimation of the beam in that plane. From the compressor prism 26 the beam propagates via the mirrors 27 and 29 to the hologram 2.

Defining now a coordinate system (x', y') in the hologram plane (see FIG. 3) where coordinates (x'=0, y'=0) represent the intersection 32 of the decollimated beam's central ray 30 with the hologram 9, the angular components of divergence/convergence in the x' and y' directions, $w_{x'}$ and $w_{y'}$, of the ray 31 illuminating the hologram 9 at point (x', y') are given respectively by $$w_{x'} = \frac{2^{1/2} W}{n(R + 2WL)} x' \qquad \text{equ. (2)}$$

$$w_{y'} = \frac{W}{n(R + WL)} y' \qquad \text{equ. (3)}$$

where L is the propagation distance of the beam from the lens 24 to the hologram 9.

In fact this is not strictly correct since it assumes that the divergence of the beam 17 through the prism 4 is the same as that through air. Also, the propagation distance through the prism 11 varies as the beam 17 scans in the x direction. However, for L>>prism dimension, this departure and variation thereof are small, and so, for the purposes of this description, will be neglected. In any case they may be eliminated in practice by small adjustments to the beam decollimator 22.

It should be noted that decollimating the beam changes the spot radius at the hologram plane. Clearly this must be limited otherwise if the spot is too small the overlapping raster scan will not produce a good uniformity, whilst if the spot is to big there will be poor image focus. Preferably the spot size variation should be kept to ~±20%. If this restricts unacceptably the image magnification obtainable, then the distance of the reconstructed image from the hologram, in other words the separation between mask and holographic layer at recording, should be increased (see later).

Let us now consider the interaction of the decollimated beam 17 with the hologram 9. Referring to FIGS. 4a and 4b, which show respectively the interaction as viewed in the xz and yz planes, of a ray 33 with the hologram wherein the oblique lines 34 represent the locally recorded interference fringes of the TIR transmission hologram within the layer. A TIR hologram is in fact a more complicated structure: as well as the TIR transmission hologram, there is a TIR reflection hologram, which also contributes to image formation, and a Lippmann hologram that does not contribute to image formation. The equations in the analysis that follows are valid for image reconstruction from both reflection and transmission components of the TIR hologram.

The angular components in the x' and y' directions, $\phi_{x'}$ and $\phi_{y'}$, respectively, of a ray reconstructed from the TIR hologram are related to the angular components $\theta_{x'}$ and $\theta_{y'}$, of a ray incident (from glass) on the hologram by $$d_x (\sin\phi_{x'} - n \sin\theta_{x'}) = \lambda \qquad \text{equ.(4)}$$

$$d_y (\sin\phi_{y'} - n \sin\theta_{y'}) = \lambda \qquad \text{equ.(5)}$$

where $d_x$ and $d_y$ are the periods in the x and y directions of the locally recorded interference pattern in the hologram 9 (the values for the TIR reflection transmission hologram are the same as the periods for the TIR reflection hologram), n is the refractive index of the hologram substrate material and λ is the wavelength of the light.

So for small changes $\delta\theta_{x'}$ and $\delta\theta_{y'}$ in the angle of the incident ray, it can be derived that:

$$\delta\phi_{x'} = \frac{n \cos\theta_{x'}}{\cos\phi_{x'}} \delta\theta_{x'} \qquad \text{equ. (6)}$$

$$\delta\phi_{y'} = \frac{n \cos\theta_{y'}}{\cos\phi_{y'}} \delta\theta_{y'} \qquad \text{equ. (7)}$$

Since the hologram 9 was recorded with an object beam at normal incidence, it follows that in the absence of any beam decollimation the features will be reconstructed in a direction normal to the hologram surface. Hence, the angular displacement of a reconstructed feature arising from an angular displacement of an incident ray can be found by putting $\phi_{x'}$ and $\phi_{y'}=0$ (as well as $\theta_{x'}=45°$ and $\theta_{y'}=0$) into equs. (6) and (7) whence:

$$\delta\phi_{x'} = \frac{n}{2^{1/2}} \delta\theta_{x'} \qquad \text{equ. (8)}$$

$$\delta\phi_{y'} = n\delta\theta_{y'} \qquad \text{equ. (9)}$$

Consequently, if the reconstructed image is formed at a distance d from the hologram, the lateral displacements $\delta x'$ and $\delta y'$ of a reconstructed feature caused by an angular displacement of the illuminating ray are given respectively by $$\delta x' = \frac{dn}{2^{1/2}} \delta\theta_{x'} \qquad \text{equ. (10)}$$

$$\delta y' = dn\delta\theta_{y'} \qquad \text{equ. (11)}$$

Hence, from equs. (2), (3), (10) and (11), a decollimation of the illuminating beam produces a lateral displacement $(\delta x', \delta y')$ of a feature at (x', y') in the reconstructed image according to $$\delta x' = \frac{dW}{R + 2WL} x' \qquad \text{equ. (12)}$$

$$\delta y' = \frac{dW}{R + WL} y' \qquad \text{equ. (13)}$$

If R is chosen such that R>>WL and such that the approximation of the denominators in the above expressions to R+1.5 WL correspond to shifts of the feature that are negligible with respect to the overlay accuracy required, then the above equations can be recognised as describing a magnification of the locally reconstructed image of magnitude $$M = \frac{dW}{R + 1.5WL} \quad \text{equ. (14)}$$

Rearranging this, it follows that if the image magnification required is M, then the decollimation of the beam leaving the beam decollimator 22 needs to be $$W = \frac{MR}{d - 1.5LM} \quad \text{equ. (15)}$$

It should be noted that the decollimation required can be reduced by increasing d, in other words increasing the separation of mask and holographic layer at recording.

From equ. (12) it is evident that if the illumination beam scans in the x (or −x) direction with a constant speed motion of velocity v, so the locally reconstructed image will 'migrate' in the opposite direction with a speed $$u = \frac{dWv}{R + 2WL} = M_x v \quad \text{equ. (16)}$$

where $M_x$ is the exact image magnification in the x direction.

In order that the reconstructed image remains stationary with respect to the photoresist layer during a scan pass 5 and so that the complete printed image has a magnification M, it is therefore necessary that the photoresist layer 13 be translated with a speed Mv in the direction opposite to that of the scanning beam 17.

Similarly, when the illuminating beam 17 steps in the y direction by a distance t between scan-passes, so the locally reconstructed image will shift in the opposite direction by a distance $$s = \frac{dWt}{R + WL} = M_y t \quad \text{equ. (17)}$$

where $M_y$ is the exact image magnification in the y direction.

Therefore in order that the beam stepping does not cause a displacement of the reconstructed image with respect to the photoresist layer 13 and so that the complete printed image has a magnification M, the photoresist layer 13 must be stepped in the opposite direction by a distance Mt.

Let us now take a specific example. Using the values previously attributed to d, R, L, v and t (200 μm, 10 mm, 1 m, 10 cm/s and 5 mm respectively), if the required image magnification is $2 \times 10^{-5}$, then the decollimation of the beam emerging from the beam decollimator 22 needs to be 1.2 mR (from equ. (15)). This decollimation is obtained by displacing lens 24 towards lens 23 by a distance of 1.2 mm (from equ. (1)). For the reconstructed image to remain stationary with respect to the photoresist layer 13 as the beam 17 raster scans, then during scan-passes parallel to the x-axis the wafer 12 must be translated in the opposite direction with a speed of 2 μm/s (from equ. (16)) and when the beam 17 steps in the y direction between scan-passes so the wafer 12 must be stepped in the opposite direction by a distance 0.1 μm (from equ. (17)).

For cases of low image magnification and/or low feature resolution a collimated scanning beam may be employed without unacceptably degrading feature definition (N.B. degradation is also a function of beam size). For instance if the feature resolution is ~4μm and the image magnification required is $4 \times 10^{-6}$ then for the same values of d, R, L, v and t, it is sufficient to translate the wafer in the x-direction with a speed of 0.4 μm/s (from equ. (16)) as the beam scans and to step it in the y-direction by a distance of 20 nm (from equ. (17)) as the beam steps.

It should be mentioned that aberrational effects associated with holographic imaging should be taken into consideration when applying the present invention: angularly displacing a reconstruction beam away from the reverse direction of the reference beam during recording introduces aberrations into the reconstructed image. The quality of a magnified image therefore necessarily deteriorates with increasing magnification and is moreover strongly dependent on feature resolution. For most practical applications, however, these effects are negligible.

REFERENCES

1. K. Stetson, "Holography with Totally Internally Reflected Light", Applied Physics Letters, Vol. 11, p. 225 (1967).
2. I. N. Ross, G. M. Davis, D. Klemitz, "High Resolution Holographic Image projection at Visible and Ultraviolet Wavelengths," Applied Optics, vol. 27, p. 967 (1988).
3. R. Dändliker, J.Brook, "Holographic Photolithography for Submicron VLSI Structures," IEEE Conf. Proc. Holographic Systems, Components and Applications, Bath, U.K., pp. 127–132 (1989).
4. S. Gray, M. Hamidi, "Holographic Microlithography for Flat Panel Displays," SID '91 Conf. Proceedings, Vol. XXII, pp. 854–857 (1991).
5. B. A. Omar, F. S. M. Clube, M. Hamidi, D. Struchen, S. Gray, "Advances in Holographic Lithography," Solid State Technology, pp. 89–93, September 1991.
6. F. Clube, S. Gray, M. Hamidi, B. Omar, D. Struchen, J.-C. Tisserand, "Holographic Mask-Aligner", SPIE Optical/Laser Microlithography V, Vol. 1674, pp. 783–792 (1992).

I claim:

1. A method for imparting an amount of magnification/demagnification into an image printed from a TIR hologram into a photosensitive layer, the TIR hologram being spaced apart from the photosensitive layer and optically intermediate the photosensitive layer and a scanning beam source, the method comprising:

(a) projecting a scanning beam from the scanning beam source along an optical path to intersect the TIR hologram to reconstruct the image from the TIR hologram, the scanning beam moving to produce a scanning beam movement in a given direction;

(b) decollimating the scanning beam by an amount sufficient to impart the amount of magnification/demagnification into the image reconstructed from the TIR hologram;

(c) reconstructing the image from the TIR hologram with the decollimated scanning beam; and (d) moving the TIR hologram relative to the photosensitive layer by an amount substantially equal to the scanning beam movement multiplied by the amount of magnification/demagnification, such that for a magnification of the image the direction of the movement of the TIR hologram relative to the photosensitive layer is the same as the given direction and for a demagnification of the image the direction of the movement of the TIR hologram relative to the photosensitive layer is opposite to the given direction.

2. The method of claim 1, wherein decollimating the scanning beam includes passing the scanning beam through an anamorphic optical element prior to intersecting the TIR hologram.

3. The method of claim 1, further comprising scanning the TIR hologram in a rastor pattern.

4. The method of claim 1, wherein decollimating the scanning beam includes passing the scanning beam through a pair of doublets and an anamorphic optical element.

5. The method of claim 1, wherein decollimating the scanning beam decollimates the scanning beam by an amount W=MR/d−1.5 LM for R>>WL; where M is the magnification, L is the propagation distance of the scanning beam from a decollimator to the TIR hologram; d is the distance between the TIR hologram and the photosensitive layer; and R is the $1/e^2$ radius of the scanning beam emerging from the decollimator.

6. The method of claim 1 wherein the scanning beam movement is a constant speed motion.

7. The method of claim 1 wherein the scanning beam movement is a stepping motion between successive scans in a raster pattern.

8. An apparatus for imparting an amount of magnification/demagnification into an image printed from a TIR hologram into a photosensitive layer, comprising:
   (a) a scanning beam generator for creating a scanning beam along an optical path to intersect the TIR hologram and reconstruct the image, the scanning beam moving in a scanning direction by a scanning movement;
   (b) a decollimator for decollimating the scanning beam by an amount sufficient to impart the amount of magnification/demagnification into the image reconstructed from the TIR hologram;
   (c) means for locating the TIR hologram and the photosensitive layer such that the TIR hologram is optically intermediate the photosensitive layer and the scanning beam generator;
   (d) means for moving one of the TIR hologram and the photosensitive layer; and
   (e) means for coupling the relative movement of the TIR hologram and the photosensitive layer with the scanning beam movement such that the movement of the TIR hologram relative to the photosensitive layer is equal to the scanning beam movement multiplied by the magnification/demagnification, such that for a magnification of the image the direction of the movement of the TIR hologram relative to the photosensitive layer is the same as the scanning direction and for a demagnification of the image the direction of the movement of the TIR hologram relative to the photosensitive layer is opposite to the scanning direction.

9. The apparatus of claim 8, wherein the decollimator includes an anamorphic optical element.

10. The apparatus of claim 8, wherein the decollimator includes a pair of doublets.

11. The apparatus of claim 10, wherein a first one of the doublets is moveable relative to a second one of the doublets.

12. The apparatus of claim 10, wherein the decollimator includes an anamorphic optical element.

13. The apparatus of claim 8, wherein the decollimator decollimates the scanning beam by an amount W=Mr/d−1.5 LM for R>>WL; where M is the magnification, L is the propagation distance of the scanning beam from the decollimator to the TIR hologram; d is the distance between the TIR hologram and the photosensitive layer; and R is the $1/e^2$ radius of the scanning beam emerging from the decollimator.

14. The method of claim 13, further comprising moving one of the conjugate lenses relative to a remaining conjugate lens.

15. The apparatus of claim 8, wherein the scanning beam generator creates a constant speed motion of the scanning beam movement in the given direction.

16. The apparatus of claim 18, wherein the scanning beam generator creates a stepping motion between successive scan passes of a raster scan pattern.

17. The apparatus of claim 8, wherein the decollimator includes an anamorphic optical element in order that the magnification/demagnification of the reconstructed image is substantially isotropic.

18. A method for imparting an amount of magnification/demagnification into an image printed from a TIR hologram into a photosensitive layer, the TIR hologram being spaced apart from the photosensitive layer and optically intermediate the photosensitive layer and a scanning beam source, the method comprising:
   (a) projecting a scanning beam from the scanning beam source along an optical path to intersect the TIR hologram to reconstruct the image from the TIR hologram, the scanning beam moving in a given direction to produce a scanning beam movement; p1 (b) passing the scanning beam through a pair of doublets and an anamorphic optical element to decollimate the scanning beam by an amount sufficient to impart the amount of magnification/demagnification into the image reconstructed from the TIR hologram;
   (c) reconstructing the image from the TIR hologram with the decollimated scanning beam; and
   (d) moving the TIR hologram relative to the photosensitive layer by an amount substantially equal to the scanning beam movement multiplied by the amount of magnification/demagnification, such that for a magnification of the image the direction of the movement of the TIR hologram relative to the photosensitive layer is the same as the given direction and for a demagnification of the image the direction of the movement of the TIR hologram relative to the photosensitive layer is opposite to the given direction.

19. The method of claim 18 wherein the scanning beam movement is a constant speed motion.

20. The method of claim 18, wherein the scanning beam movement is a stepping motion between successive scans in a raster pattern.

21. An apparatus for imparting an amount of magnification/demagnification into an image printed from a TIR hologram into a photosensitive layer, comprising:
   (a) a scanning beam generator for creating a scanning beam along an optical path to intersect the TIR hologram and reconstruct the image, the scanning beam moving in a scanning direction by a scanning movement;
   (b) a pair of doublets and an anamorphic optical element for decollimating the scanning beam by an amount sufficient to impart the amount of magnification/demagnification into the image reconstructed from the TIR hologram;
   (c) means for locating the TIR hologram and the photosensitive layer in the optical path such that the TIR hologram is optically intermediate the photosensitive layer and the scanning beam generator; and
   (d) means for moving the TIR hologram relative to the photosensitive layer by an amount substantially is equal to the scanning beam movement multiplied by the magnification/demagnification, such that for a magnification of the image the direction of the movement of the TIR hologram relative to the photosensitive layer is the same as the scanning direction and for a demagnification of the image the direction of the movement of the TIR hologram relative to the photosensitive layer is opposite to the scanning direction.

22. The apparatus of claim 21, wherein the scanning beam generator creates a constant speed motion of the scanning beam movement in the given direction.

23. The apparatus of claim 21, wherein the scanning beam generator creates a stepping motion between successive scan passes of a raster scan pattern.

24. An apparatus for imparting an amount of magnification/demagnification into an image printed from a TIR hologram into a photosensitive layer, comprising:
 (a) a scanning beam generator for creating a scanning beam along an optical path to intersect the TIR hologram and reconstruct the image, the scanning beam moving in a scanning direction by a scanning movement;
 (b) a decollimator having a pair of doublets for decollimating the scanning beam by an amount sufficient to impart the magnification/demagnification into the image reconstructed from the TIR hologram;
 (c) means for locating the TIR hologram and the photosensitive layer such that the TIR hologram is optically intermediate the photosensitive layer and the scanning beam generator; and
 (d) means for moving one of the TIR hologram and the photosensitive layer such that the relative movement of the TIR hologram and the photosensitive layer is substantially is equal to the scanning beam movement multiplied by the magnification/demagnification, such that for a magnification of the image the direction of the movement of the TIR hologram relative to the photosensitive layer is the same as the scanning direction and for a demagnification of the image the direction of the movement of the TIR hologram relative to the photosensitive layer is opposite to the scanning direction.

25. The apparatus of claim 24, wherein a second lens of the doublets is moveable relative to a first lens of the doublets.

26. The apparatus of claim 25, wherein the decollimator includes an anamorphic optical element in order that the magnification/demagnification of the reconstructed image is substantially isotropic.

27. The apparatus of claim 24, wherein the decollimator decollimates the scanning beam by an amount $W=MR/d-1.5 LM$ for $R>>WL$; where M is the magnification, L is the propagation distance of the scanning beam from the decollimator to the TIR hologram; d is the distance between the TIR hologram and the photosensitive layer; and R is the $1/e^2$ radius of the scanning beam emerging from the decollimator.

* * * * *